United States Patent
He et al.

(10) Patent No.: US 11,656,266 B2
(45) Date of Patent: May 23, 2023

(54) METHOD AND SYSTEM FOR ONLINE MONITORING OF HEALTH STATUS OF INSULATED-GATE BIPOLAR TRANSISTOR MODULE

(71) Applicant: WUHAN UNIVERSITY, Hubei (CN)

(72) Inventors: Yigang He, Hubei (CN); Weibo Yuan, Hubei (CN); Guolong Shi, Hubei (CN); Liulu He, Hubei (CN); Chaolong Zhang, Hubei (CN); Bolun Du, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 195 days.

(21) Appl. No.: 17/124,496

(22) Filed: Dec. 17, 2020

(65) Prior Publication Data
US 2021/0318373 A1 Oct. 14, 2021

(30) Foreign Application Priority Data
Apr. 13, 2020 (CN) .......................... 202010286330.7

(51) Int. Cl.
*G01R 31/26* (2020.01)

(52) U.S. Cl.
CPC ..... *G01R 31/2608* (2013.01); *G01R 31/2601* (2013.01)

(58) Field of Classification Search
CPC ............ G01R 31/2608; G01R 31/2601; G01R 31/2619; G01R 31/00
See application file for complete search history.

(56) References Cited

U.S. PATENT DOCUMENTS

| | | | | |
|---|---|---|---|---|
| 2015/0226787 A1* | 8/2015 | Mankel | ..................... | G01K 7/01 702/64 |
| 2017/0350934 A1* | 12/2017 | Sathik | ................ | G01R 31/2621 |
| 2018/0017613 A1* | 1/2018 | Qiao | .................. | G01R 31/2619 |

OTHER PUBLICATIONS

B. Tian, W. Qiao, Z. Wang, T. Gachovska and J. L. Hudgins, "Monitoring IGBT's health condition via junction temperature variations," 2014 IEEE Applied Power Electronics Conference and Exposition—APEC 2014, 2014, pp. 2550-2555, doi: 10.1109/APEC. 2014.6803662. (Year: 2014).*

* cited by examiner

*Primary Examiner* — Yoshihisa Ishizuka
*Assistant Examiner* — Christopher J Gassen
(74) *Attorney, Agent, or Firm* — JCIPRNET

(57) ABSTRACT

A method and a system for online monitoring of a health status of an insulated-gate bipolar transistor (IGBT) module are provided, which belong to the field of IGBT status monitoring. In order to overcome the inability to real-time monitor health statuses of existing IGBT modules, the method of the disclosure includes the following steps. A current sensor is used to measure a collector current of each IGBT module. A collected current value is substituted into a simulation model to obtain a current imbalance rate. A failure module is located according to the current imbalance rate and temperature to achieve the objective of monitoring an IGBT health status.

16 Claims, 5 Drawing Sheets

METHOD AND SYSTEM FOR ONLINE MONITORING OF HEALTH STATUS OF INSULATED-GATE BIPOLAR TRANSISTOR MODULE

CROSS-REFERENCE TO RELATED APPLICATION

This application claims the priority benefit of China application serial no. 202010286330.7, filed on Apr. 13, 2020. The entirety of the above-mentioned patent application is hereby incorporated by reference herein and made a part of this specification.

BACKGROUND

Technical Field

The disclosure relates to the field of insulated-gate bipolar transistor (IGBT) status monitoring, and more specifically relates to a method and a system for online monitoring of an IGBT health status based on a collector current imbalance rate.

Description of Related Art

Power electronic equipment has become one of the key assemblies in various equipment. Such equipment is mainly composed of IGBT. A single IGBT chip may withstand a maximum current of 200 A, which is far from satisfying the current level requirements in current power conversion devices. If the current continues to rise, the modules are required to be connected in parallel to form a system, or the modules are required to be directly connected in parallel. There are many occasions where IGBT modules are required to be connected in parallel, which all play a very important role in the applications of IGBT parallel connection. For example, when the IGBT module of the required current level does not exist; although the IGBT module may satisfy the current level requirements, the packaging thereof cannot satisfy the requirements of rated parameters; or for many mass-produced equipment, the mechanical structures thereof are relatively fixed, modules of specific packaging are required. During the operation process of parallel modules, the most important indicator is whether each module can share the same current, which is not only related to the life-span and reliability of each module, but is also related to the efficiency of the entire system, and is the key to ensuring the stable operation of the system.

There are many failure types of the IGBT. In general, failures may be divided into two main types: sudden failure and gradual failure. The sudden failure is an unpredictable failure that may occur at any stage during the usage process of the device. The gradual failure is a failure from quantitative change to qualitative change due to the working status of the device over time, which is predictable in terms of time. At the same time, the main form of failure of the gradual failure is packaging failure, which is divided into two failure modes: solder layer failure and bonding wire failure.

The solder layer failure mainly causes the junction temperature to increase. For most of the current IGBT devices, the positive temperature coefficient technology which is basically adopted ensures that the modules have current sharing ability when connected in parallel. That is, the module with the higher temperature receives less current in parallel branches, thereby forming negative feedback to ensure that the aging process of the module with solder layer aging will not further accelerate. However, such self-adjusting ability of temperature is not very effective. After the solder layer aging begins, unless the heat dissipation ability of the system is increased, the aging process will gradually accelerate until the chip falls off or other problems arise to cause module failure.

The bonding wire failure mainly causes the increase of on-resistance of the module, and the increase of external on-state voltage drop. Although the resistance of a single bonding wire is less than the on-resistance of the chip, when multiple bonding wires fall off together, the increased resistance cannot be neglected. For each branch of the parallel modules, the falling off of the bonding wires causes a more serious problem of uneven current distribution. When the current value passing through an aged module decreases, more current will pass through other normal modules, which may even cause other modules to be overloaded, thereby accelerating the failure of other modules. Therefore, there is necessity to properly derate the entire system.

Regardless of the failure mode, the manifestation of the potential failure thereof is different from the manifestation of a single transistor, which has become a blind spot for online health monitoring.

SUMMARY

The disclosure provides a method and a system for online monitoring of a health status of an insulated-gate bipolar transistor (IGBT) based on a collector current imbalance rate. Through a real-time online manner, the health status of each parallel IGBT module is assessed and monitored without historical data.

In order to achieve the above objective, according to an aspect of the disclosure, a method for online monitoring of a health status of an IGBT module is provided, which includes the following steps.

An abnormal IGBT module is determined according to a collector current value of each IGBT module among parallel IGBT modules.

The collector current value of each abnormal IGBT module is extracted and compared with a maximum value among measured collector current values of normal IGBT modules to obtain a current imbalance rate of each abnormal IGBT module.

An abnormal type of an IGBT module is determined according to a case temperature of each IGBT module among the parallel IGBT modules.

For any abnormal IGBT module, the current imbalance rate and the case temperature of the abnormal IGBT module are brought into a parallel IGBT health status detection model, and whether the abnormal IGBT module fails is determined according to the abnormal type of the abnormal IGBT module.

Preferably, the step of determining the abnormal IGBT module according to the collector current value of each IGBT module among the parallel IGBT modules includes the following step.

The collector current value of each IGBT module among the parallel IGBT modules is compared, and an IGBT module with the collector current value less than a preset current value is regarded as the abnormal IGBT module.

The step of determining the abnormal type of the IGBT module according to the case temperature of each IGBT module among the parallel IGBT modules includes the following step.

The case temperature of each IGBT module among the parallel IGBT modules is compared, an IGBT module with the case temperature less than a preset case temperature value is regarded as an abnormal bonding wire IGBT module, and an IGBT module with the case temperature equal to the preset case temperature value is regarded as an abnormal solder layer IGBT module.

Preferably, the current imbalance rate of each abnormal IGBT module is determined $$\alpha = \frac{I'_C}{I_C},$$

from where $I_C$ is the maximum value among the measured collector current values of the normal IGBT modules, and $I_C'$ is the collector current of the abnormal IGBT module.

Preferably, the parallel IGBT health status detection model is:

$$\frac{I'_C}{I_C} = \frac{[V_{dc} - (V_o + \Delta V)]R - (n-1) \cdot R_{load} \cdot \Delta V}{(V_{dc} - V_o)(R + \Delta R + \Delta R') + R_{load} \cdot \Delta V}$$

If $\Delta V = 0$, then $\alpha = \frac{R}{R + \Delta R + \Delta R'}$ $$\begin{cases} \Delta V = \frac{V_o^{max} - V_o^{typ}}{T^{max} - T^{typ}}(T_j - T^{typ}) + V_o^{typ} = k_1 \Delta T_j + b_1 \\ \Delta R = \frac{R^{max} - R^{typ}}{T^{max} - T^{typ}}(T_j - T^{typ}) + R^{typ} = k_2 \Delta T_j + b_2 \end{cases}$$

$$T_j = P_{loss} \cdot r_{jc} + T_C = (P_{sw} + P_{cond}) \cdot r_{jc} + T_C$$

$$\Delta T_j = P_{loss} \cdot \Delta r_{jc} + T_C = (P_{sw} + P_{cond}) \cdot \Delta r_{jc} + T_C$$

where $V_{dc}$ is the external voltage of the main circuit, $V_o$ is the on voltage of the IGBT module when the temperature is at a room temperature of 25° C., R is the on-resistance of the IGBT module when the temperature is at a room temperature of 25° C., $\Delta V$ is the increment of the on voltage at different temperatures, $\Delta R$ is the increment of the on-resistance at different temperatures, $\Delta R'$ is the increment of the on-resistance when a bonding wire within the IGBT module is broken, $R_{load}$ is the load resistance, $V_o^{max}$ is the on voltage value at a maximum temperature $T^{max}$ given in a data sheet, $V_o^{typ}$ is the on voltage value at a typical temperature $T^{typ}$ given in the data sheet, $R^{max}$ is the on-resistance value at the maximum temperature $T^{max}$ given in the data sheet, $R^{typ}$ is the on-resistance value at the typical temperature $T^{typ}$ given in the data sheet, $T_j$ is the real-time working temperature of the internal chip of the IGBT module, n represents the parallel module format, $k_1$ and $b_1$ represent the function coefficients of the on voltage changing with temperature, $k_2$ and $b_2$ represent the function coefficients of the on-resistance changing with temperature, $\Delta T_j$ represents the increment of the junction temperature caused by different failure processes, $P_{loss}$ represents the power loss of the IGBT module, which includes a switching power loss $P_{sw}$ and a conduction power loss $P_{cond}$, $r_{jc}$ represents the thermal resistance of the IGBT module from the chip to the case, $T_C$ represents the case temperature of the IGBT module, and $\Delta r_{jc}$ represents the increment of the thermal resistance caused by different failure processes.

Preferably, the step of determining whether the abnormal IGBT module fails according to the abnormal type of the abnormal IGBT module includes the following steps.

If the abnormal type of the abnormal IGBT module is bonding wire breakage abnormality, the increment of the on-resistance of the abnormal IGBT module at different temperatures is obtained from the parallel IGBT health status detection model. Whether the increment of the on-resistance of the abnormal IGBT module at different temperatures is greater than a preset resistance increment value is determined. If the increment is greater than the preset resistance increment value, it is determined that the abnormal IGBT module fails due to bonding wire breakage. Otherwise, it is determined that the abnormal IGBT module does not fail.

If the abnormal type of the abnormal IGBT module is solder layer aging abnormality, the increment of the thermal resistance of the abnormal IGBT module is obtained from the parallel IGBT health status detection model. Whether the increment of the thermal resistance of the abnormal IGBT module is greater than a preset thermal resistance increment value is determined. If the increment is greater than the preset thermal resistance increment value, it is determined that the IGBT module fails due to solder layer aging. Otherwise, it is determined that the IGBT module does not fail.

According to another aspect of the disclosure, a system for online monitoring of a health status of an IGBT module is provided, which includes the following.

An abnormality determination module is configured to determine an abnormal IGBT module according to a collector current value of each IGBT module among parallel IGBT modules.

A current imbalance rate calculation module is configured to extract the collector current value of each abnormal IGBT module to be compared with a maximum value among measured collector current values of normal IGBT modules to obtain a current imbalance rate of each abnormal IGBT module.

An abnormal type determination module is configured to determine an abnormal type of an IGBT module according to a case temperature of each IGBT module among the parallel IGBT modules.

A failure determination module is configured to bring the current imbalance rate and the case temperature of the abnormal IGBT module into a parallel IGBT health status detection model for any abnormal IGBT module, and determine whether the abnormal IGBT module fails according to the abnormal type of the abnormal IGBT module.

Preferably, the abnormality determination module is configured to compare the collector current value of each IGBT module among the parallel IGBT modules, and regard an IGBT module with the collector current value less than a preset current value as the abnormal IGBT module.

The abnormal type determination module is configured to compare the case temperature of each IGBT module among the parallel IGBT modules, regard an IGBT module with the case temperature less than a preset case temperature value as an abnormal bonding wire IGBT module, and regard an IGBT module with the case temperature equal to the preset case temperature value as an abnormal solder layer IGBT module.

Preferably, the current imbalance rate of each abnormal IGBT module is determined from $$\alpha = \frac{I'_C}{I_C},$$

where $I_C$ is the maximum value among the measured collector current values of the normal IGBT modules, and $I_C'$ is the collector current of the abnormal IGBT module.

Preferably, the parallel IGBT health status detection model is:

$$\frac{I_C'}{I_C} = \frac{[V_{dc} - (V_o + \Delta V)]R - (n-1) \cdot R_{load} \cdot \Delta V}{(V_{dc} - V_o)(R + \Delta R + \Delta R') + R_{load} \cdot \Delta V}$$

If $\Delta V = 0$, then $\alpha = \dfrac{R}{R + \Delta R + \Delta R'}$ $$\begin{cases} \Delta V = \dfrac{V_o^{max} - V_o^{typ}}{T^{max} - T^{typ}}(T_j - T^{typ}) + V_o^{typ} = k_1 \Delta T_j + b_1 \\ \Delta R = \dfrac{R^{max} - R^{typ}}{T^{max} - T^{typ}}(T_j - T^{typ}) + R^{typ} = k_2 \Delta T_j + b_2 \end{cases}$$

$$T_j = P_{loss} \cdot r_{jc} + T_C = (P_{sw} + P_{cond}) \cdot r_{jc} + T_C$$

$$\Delta T_j = P_{loss} \cdot \Delta r_{jc} + T_C = (P_{sw} + P_{cond}) \cdot \Delta r_{jc} + T_C$$

where $V_{dc}$ is the external voltage of the main circuit, $V_o$ is the on voltage of the IGBT module when the temperature is at a room temperature of 25° C., R is the on-resistance of the IGBT module when the temperature is at a room temperature of 25° C., $\Delta V$ is the increment of the on voltage at different temperatures, $\Delta R$ is the increment of the on-resistance at different temperatures, $\Delta R'$ is the increment of the on-resistance when a bonding wire within the IGBT module is broken, $R_{load}$ is the load resistance, $v_o^{max}$ is the on voltage value at a maximum temperature $T^{max}$ given in a data sheet, $V_o^{typ}$ is the on voltage value at a typical temperature $T^{typ}$ given in the data sheet, $R^{max}$ is the on-resistance value at the maximum temperature $T^{max}$ given in the data sheet, $R^{typ}$ is the on-resistance value at the typical temperature $T^{typ}$ given in the data sheet, $T_j$ is the real-time working temperature of the internal chip of the IGBT module, n represents the parallel module format, $k_1$ and $b_1$ represent the function coefficients of the on voltage changing with temperature, $k_2$ and $b_2$ represent the function coefficients of the on-resistance changing with temperature, $\Delta T_j$ represents the increment of the junction temperature caused by different failure processes, $P_{loss}$ represents the power loss of the IGBT module, which includes a switching power loss $P_{sw}$ and a conduction power loss $P_{cond}$, $r_{jc}$ represents the thermal resistance of the IGBT module from the chip to the case, $T_C$ represents the case temperature of the IGBT module, and $\Delta r_{jc}$ represents the increment of the thermal resistance caused by different failure processes.

Preferably, the failure determination module is configured to obtain the increment of the on-resistance of the abnormal IGBT module at different temperatures from the parallel IGBT health status detection model when the abnormal type of the abnormal IGBT module is bonding wire breakage abnormality, and determine whether the increment of the on-resistance of the abnormal IGBT module at different temperatures is greater than a preset resistance increment value. If the increment is greater than the preset resistance increment value, it is determined that the abnormal IGBT module fails due to bonding wire breakage. Otherwise, it is determined that the abnormal IGBT module does not fail.

When the abnormal type of the abnormal IGBT module is solder layer aging abnormality, the increment of the thermal resistance of the abnormal IGBT module is obtained from the parallel IGBT health status detection model. Whether the increment of the thermal resistance of the abnormal IGBT module is greater than a preset thermal resistance increment value is determined. If the increment is greater than the preset thermal resistance increment value, it is determined that the IGBT module fails due to solder layer aging. Otherwise, it is determined that the IGBT module does not fail.

According to another aspect of the disclosure, a computer-readable storage medium is provided, which is stored with a program instruction. When the program instruction is executed by a processor, the method for online monitoring of the health status of the IGBT module is implemented.

In general, compared with the prior art, the above technical solutions conceived by the disclosure can achieve the following beneficial effects.

According to the current state of IGBT module application development, the disclosure conducts a detailed research on electrical characteristics of the most commonly used parallel connection of the IGBT modules, and analyzes the changing trend of electrical signal with changes in the health status of each IGBT module in detail. Based on the horizontal comparison of the electrical characteristics of each module, a method for online monitoring of a health status of parallel IGBT modules is established.

DETAILED DESCRIPTION OF DISCLOSED EMBODIMENTS

In order for the objectives, technical solutions, and advantages of the disclosure to be clearer, the disclosure is further described in detail below with reference to the accompanying drawings and embodiments. It should be understood that the specific embodiments described herein are only used to explain the disclosure, but not to limit the disclosure. In addition, the technical features involved in the various embodiments of the disclosure described below may be combined with each other as long as there is no conflict therebetween.

Figure 1:
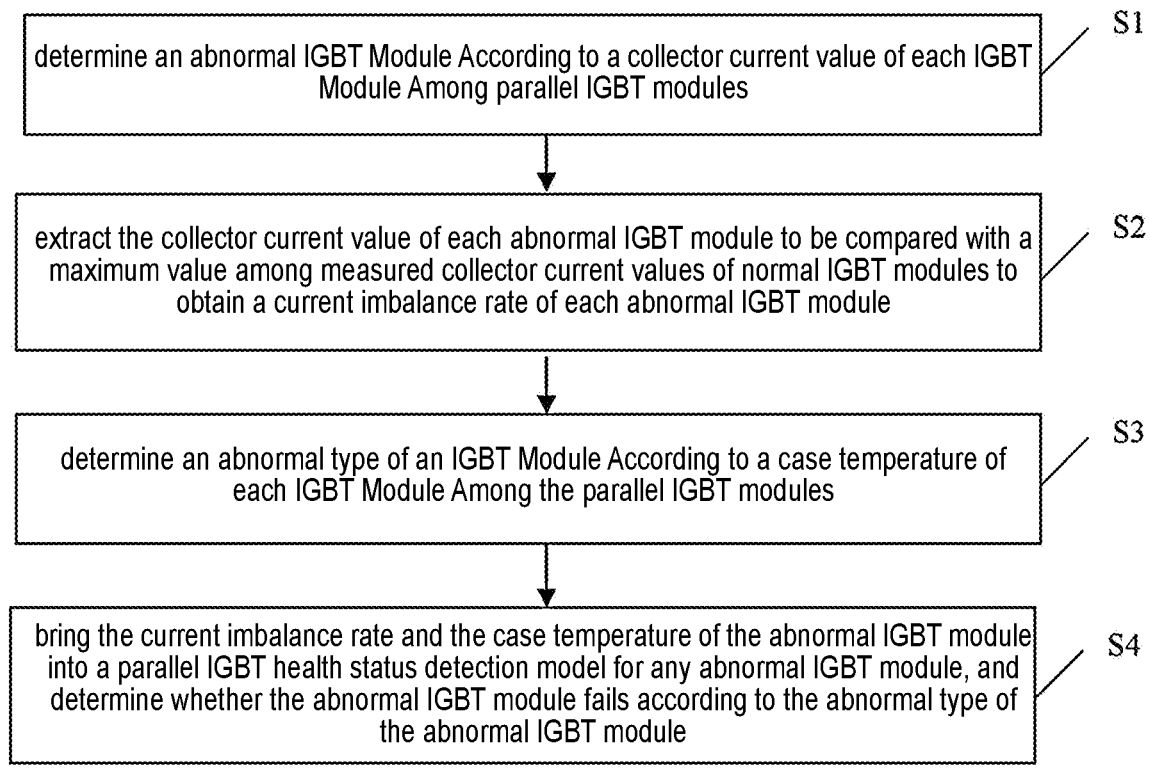
FIG. 1 is a schematic flowchart of a method according to an embodiment of the disclosure.

FIG. 1 is a schematic flowchart of a method according to an embodiment of the disclosure. The method shown in FIG. 1 includes the following steps.

Step S1: An abnormal IGBT module is determined according to a collector current value of each IGBT module among parallel IGBT modules.

In the embodiment of the disclosure, after all the current values of each IGBT module are measured, the current value of the abnormal module will be less than the current value of a normal module. The module with the smaller current value is the abnormal module.

Specifically, through comparing the collector current value of each IGBT module among the parallel IGBT modules, an IGBT module with the collector current value less than a preset current value is regarded as the abnormal IGBT module.

The preset current value may be determined according to actual requirements, and is not uniquely limited by the embodiment of the disclosure.

Step S2: A collector current value $I_c'$ of each abnormal IGBT module is extracted and compared with a maximum value $I_c$ among measured collector current values of normal IGBT modules to obtain a current imbalance rate α.

Step S3: An abnormal type of an IGBT module is determined according to a case temperature of each IGBT module among the parallel IGBT modules.

Through comparing the case temperature of each IGBT module among the parallel IGBT modules, an IGBT module with the case temperature less than a preset case temperature value is regarded as an abnormal bonding wire IGBT module, and an IGBT module with the case temperature equal to the preset case temperature value is regarded as an abnormal solder layer IGBT module.

The preset case temperature value may be determined according to actual requirements, and is not uniquely limited by the embodiment of the disclosure.

Step S4: For any abnormal IGBT module, the current imbalance rate and the case temperature of the abnormal IGBT module are brought into a parallel IGBT health status detection model, and whether the abnormal IGBT module fails is determined according to the abnormal type of the abnormal IGBT module.

If the abnormal IGBT module fails, an IGBT device is replaced. If the abnormal IGBT module does not fail, according to the aging method of the abnormal IGBT module, heat dissipation is required to be increased for a solder layer failure, and derating is required for bonding wire breakage.

In the embodiment of the disclosure, a calculation method of the current imbalance rate in Step S2 is:

$$\alpha = \frac{I_C'}{I_C},$$

where $I_C$ is the maximum value among the measured collector current values of the normal IGBT modules, and $I_C'$ is the collector current of the abnormal IGBT module.

In the embodiment of the disclosure, the parallel IGBT health status detection model in Step S4 is as follows:

$$\frac{I_C'}{I_C} = \frac{[V_{dc} - (V_o + \Delta V)]R - (n-1) \cdot R_{load} \cdot \Delta V}{(V_{dc} - V_o)(R + \Delta R + \Delta R') + R_{load} \cdot \Delta V}$$

If $\Delta V = 0$, then $\alpha = \dfrac{R}{R + \Delta R + \Delta R'}$ $$\begin{cases} \Delta V = \dfrac{V_o^{max} - V_o^{typ}}{T^{max} - T^{typ}}(T_j - T^{typ}) + V_o^{typ} = k_1 \Delta T_j + b_1 \\ \Delta R = \dfrac{R^{max} - R^{typ}}{T^{max} - T^{typ}}(T_j - T^{typ}) + R^{typ} = k_2 \Delta T_j + b_2 \end{cases}$$

-continued $$T_j = P_{loss} \cdot r_{jc} + T_C = (P_{sw} + P_{cond}) \cdot r_{jc} + T_C$$

$$\Delta T_j = P_{loss} \cdot \Delta r_{jc} + T_C = (P_{sw} + P_{cond}) \cdot \Delta r_{jc} + T_C$$

where $V_{dc}$ is the external voltage of the main circuit, $V_o$ is the on voltage of the IGBT module when the temperature is at a room temperature of 25° C., R is the on-resistance of the IGBT module when the temperature is at a room temperature of 25° C., ΔV is the increment of the on voltage at different temperatures, ΔR is the increment of the on-resistance at different temperatures, ΔR' is the increment of the on-resistance when a bonding wire within the IGBT module is broken, $R_{load}$ is the load resistance, $V_o^{max}$ is the on voltage value at a maximum temperature $T^{max}$ given in a data sheet, $V_o^{typ}$ is the on voltage value at a typical temperature $T^{typ}$ (room temperature is normally taken as 25° C.) given in the data sheet, $R^{max}$ is the on-resistance value at the maximum temperature $T^{max}$ given in the data sheet, $R^{typ}$ is the on-resistance value at the typical temperature $T^{typ}$ (room temperature is normally taken as 25° C.) given in the data sheet, $T_j$ is the real-time working temperature of the internal chip of the IGBT module, n represents the parallel module format, $k_1$ and $b_1$ represent the function coefficients of the on voltage changing with temperature, $k_2$ and $b_2$ represent the function coefficients of the on-resistance changing with temperature, $\Delta T_j$ represents the increment of the junction temperature caused by different failure processes, $P_{loss}$ represents the power loss of the IGBT module, which includes a switching power loss $P_{sw}$ and a conduction power loss $P_{cond}$, $r_{jc}$ represents the thermal resistance of the IGBT module from the chip to the case, $T_C$ represents the case temperature of the IGBT module, and $\Delta r_{jc}$ represents the increment of the thermal resistance caused by different failure processes. According to current manufacturing processes, the ΔV of most IGBT modules may be considered to be equal to zero.

The data book in the embodiment of the disclosure refers to the data book corresponding to the IGBT module used.

In the embodiment of the disclosure, Step S4 of determining whether the abnormal IGBT module fails according to the abnormal type of the abnormal IGBT module may be implemented through the following manner.

If the abnormal type of the abnormal IGBT module is bonding wire breakage abnormality, the increment of the on-resistance of the abnormal IGBT module at different temperatures is obtained from the parallel IGBT health status detection model. Whether the increment of the on-resistance of the abnormal IGBT module at different temperatures is greater than a preset increment value is determined. If the increment is greater than the preset increment value, it is determined that the abnormal IGBT module fails due to bonding wire breakage. Otherwise, it is determined that the abnormal IGBT module does not fail.

If the abnormal type of the abnormal IGBT module is solder layer aging abnormality, the increment of the thermal resistance of the abnormal IGBT module is obtained from the parallel IGBT health status detection model. Whether the increment of the thermal resistance of the abnormal IGBT module is greater than a preset increment value is determined. If the increment is greater than the preset increment value, it is determined that the IGBT module fails due to solder layer aging. Otherwise, it is determined that the IGBT module does not fail.

The IGBT device failure standard is based on the general standard of the IGBT industry. The increment of the thermal resistance or the on-resistance of each abnormal IGBT module at different temperatures may be obtained from the parallel IGBT health status detection model, and the thermal resistance or conduction of each abnormal IGBT module can be determined. Whether the increment of the thermal resistance or the on-resistance of each abnormal IGBT module is greater than the preset increment value is determined. If the increment is greater than the preset increment value, it is determined that the current IGBT module fails according to the abnormal type. Otherwise, it is determined that the current IGBT module does not fail.

The preset increment value may be determined according to actual requirements, and is not uniquely limited by the embodiment of the disclosure. At present, according to relevant standards: it may be determined that the IGBT module fails if the thermal resistance or the on-resistance increases by 20% (that is, when the thermal resistance or the on-resistance increases to 1.2 times the original resistance value). It may be inferred that the device fails when the current imbalance rate is less than 83%.

Figure 2:
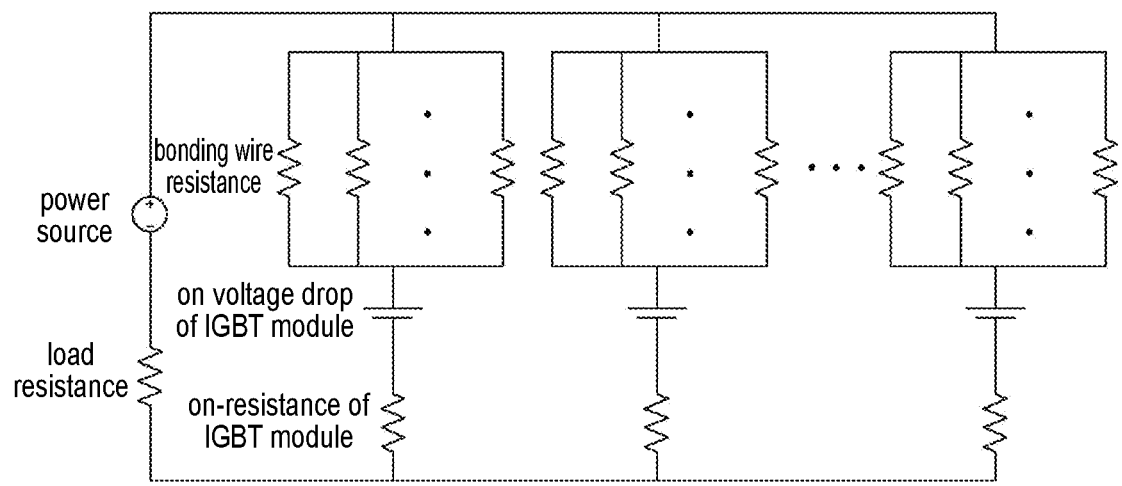
FIG. 2 is an equivalent circuit diagram of parallel modules according to an embodiment of the disclosure.

The equivalent circuit of each branch in parallel is as shown in FIG. 2. The electrical characteristics of each IGBT module may be represented by a resistor and a voltage source respectively simulating the on-resistance and on voltage drop, and the bonding wires may be represented by multiple resistors in parallel. When one of the bonding wires falls off, the total resistance of the branch thereof rises, causing uneven current distribution, which is the basic principle of the disclosure.

Figure 3:
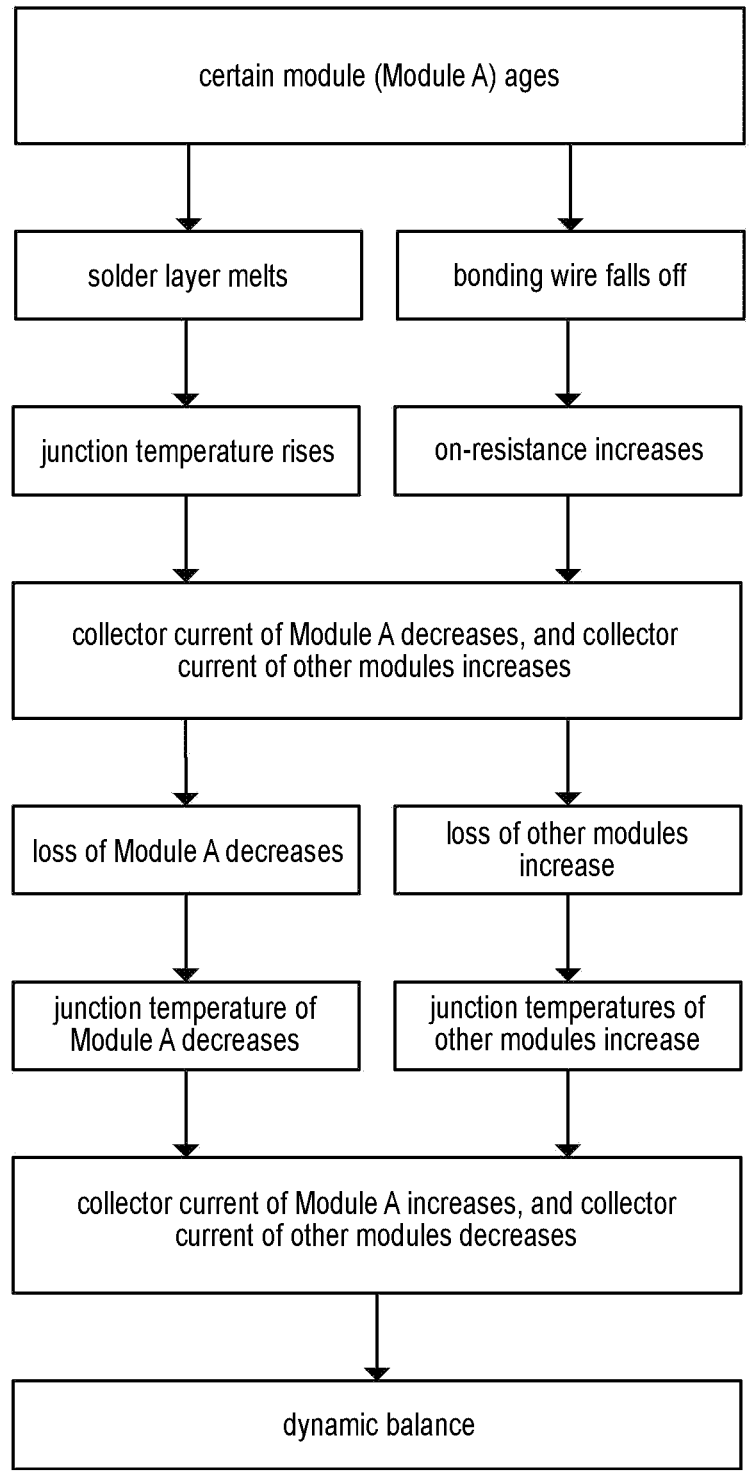
FIG. 3 is a schematic diagram of changes in each branch of a parallel current distribution according to an embodiment of the disclosure.

The principle of parallel current distribution is as shown in FIG. 3. When the solder layer melts, the junction temperature rises. Due to the positive temperature effect of the module, the collector current decreases, which causes the current of other modules to increase, resulting in unbalanced current distribution. The decreased current weakens the effect of the junction temperature rise, thereby forming a dynamic balance in the negative feedback. The falling off of the bonding wire directly causes the on-resistance to rise, thereby decreasing the collector current of the corresponding branch.

Figure 4A:
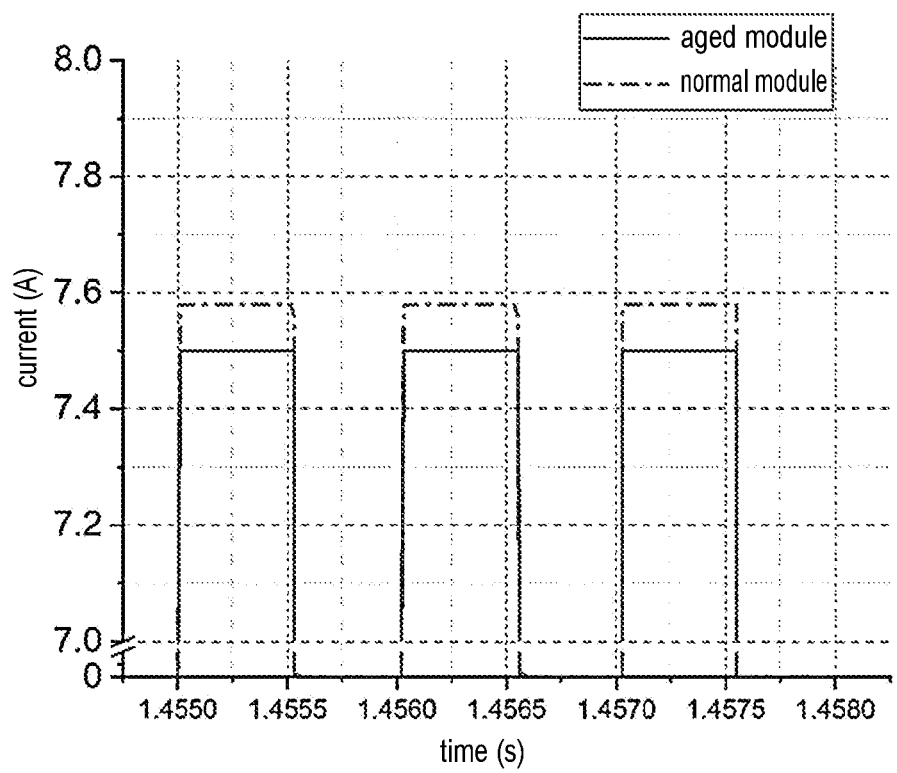
FIG. 4A is a simulation diagram of the current distribution of each module when 2 bonding wires fall off.
Figure 4B:
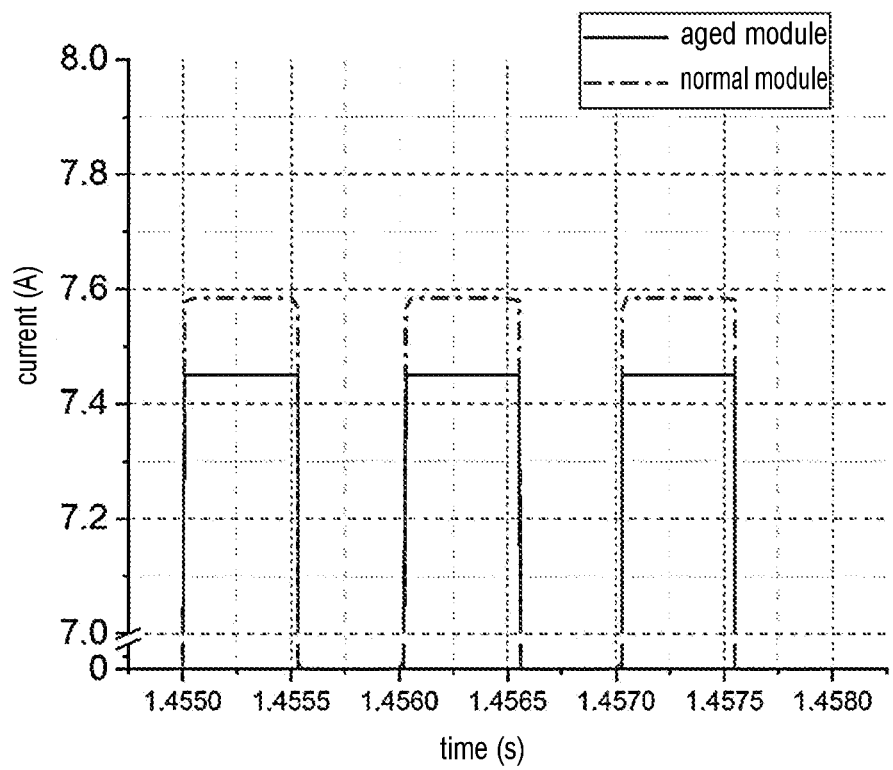
FIG. 4B is a simulation diagram of the current distribution of each module when 4 bonding wires fall off.
Figure 4C:
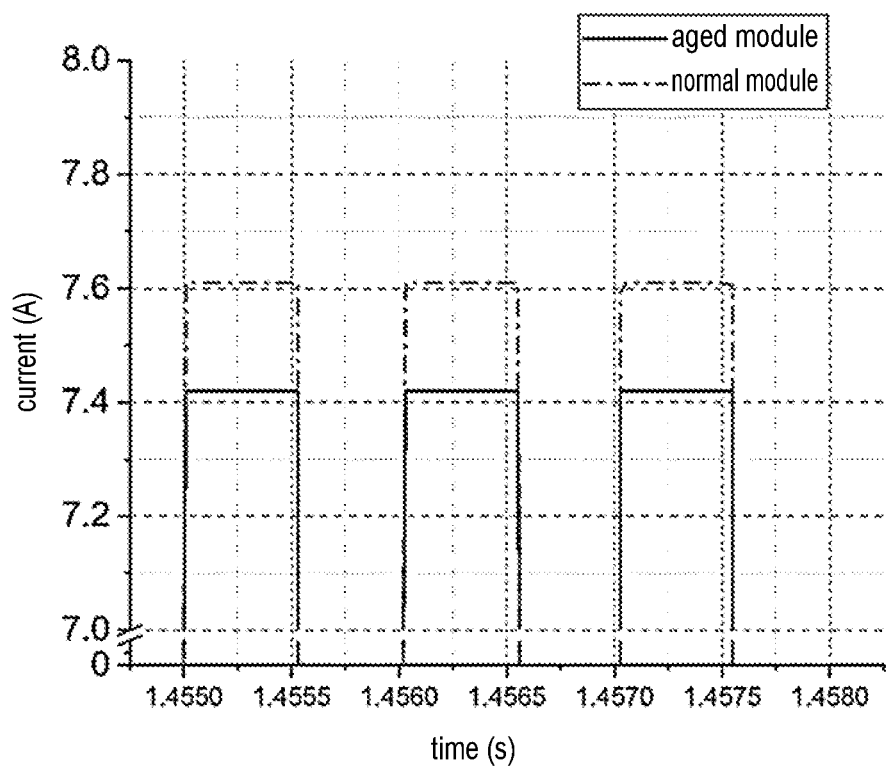
FIG. 4C is a simulation diagram of the current distribution of each module when 6 bonding wires fall off.
Figure 5:
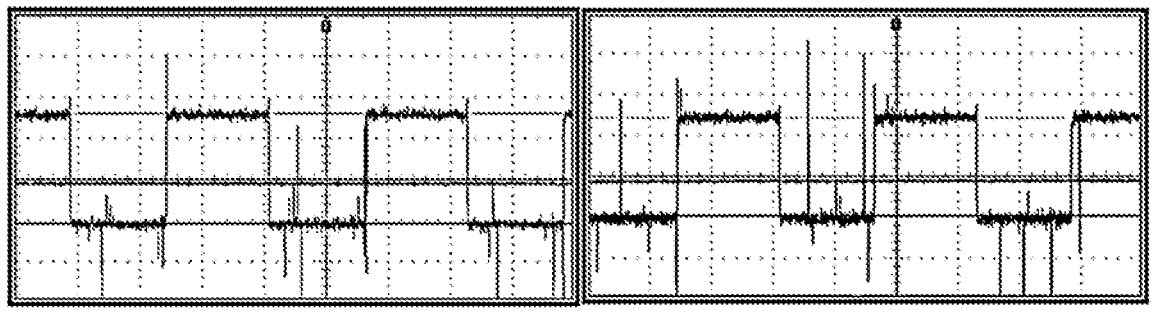
FIG. 5 is an experimental verification diagram of the collector current distributions of the faulty module and the normal module according to an embodiment of the disclosure, where the left drawing shows the current value of 9.7 A of a module with 6 bonding wires fallen off, and the right drawing shows the current value of 10.8 A of the normal module.

FIGS. 4A-4C are simulation result diagrams of collector current distributions of a faulty module and a normal module according to an embodiment of the disclosure. Specifically, FIG. 4A is the simulation diagram of the current distribution of each module when 2 bonding wires fall off. FIG. 4B is the simulation diagram of the current distribution of each module when 4 bonding wires fall off. FIG. 4C is the simulation diagram of the current distribution of each module when 6 bonding wires fall off. FIG. 5 is an experimental verification diagram of the collector current distributions of the faulty module and the normal module according to an embodiment of the disclosure, where the left drawing shows the current value of 9.7 A of a module with 6 bonding wires fallen off, and the right drawing shows the current value of 10.8 A of the normal module. In FIG. 4 and FIG. 5, the falling off of different numbers of bonding wires is used to simulate different degrees of aging of the modules.

Figure 6:
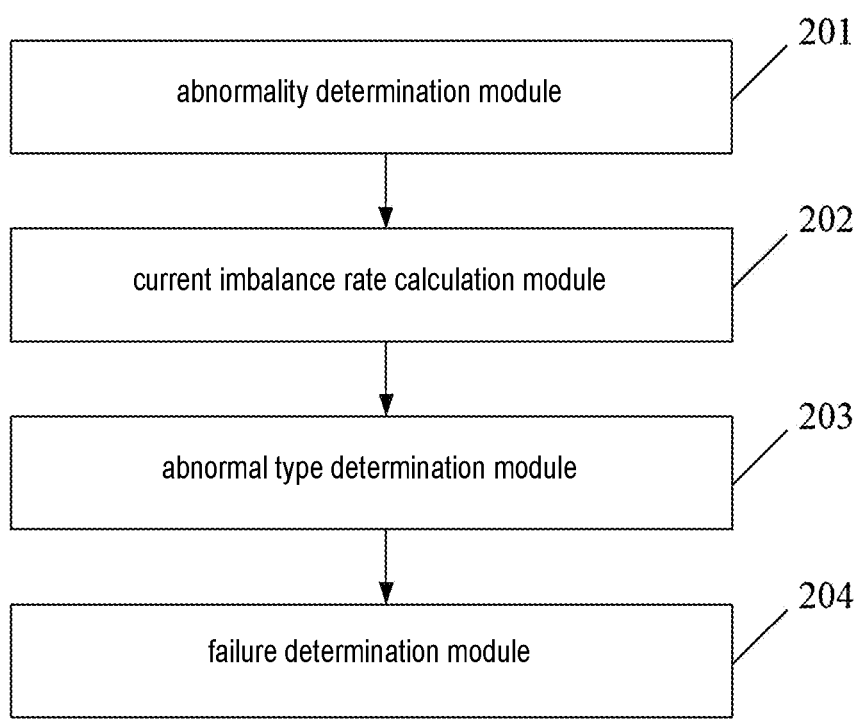
FIG. 6 is a block diagram of a system according to an embodiment of the disclosure.

As shown in FIG. 6, in another embodiment of the disclosure, a system for online monitoring of a health status of an IGBT module is also provided, which includes the following.

An abnormality determination module 201 is configured to determine an abnormal IGBT module according to a collector current value of each IGBT module among parallel IGBT modules.

A current imbalance rate calculation module 202 is configured to extract the collector current value of each abnormal IGBT module to be compared with a maximum value among measured collector current values of normal IGBT modules to obtain a current imbalance rate of each abnormal IGBT module.

An abnormal type determination module 203 is configured to determine an abnormal type of an IGBT module according to a case temperature of each IGBT module among the parallel IGBT modules.

A failure determination module 204 is configured to bring the current imbalance rate and the case temperature of the abnormal IGBT module into a parallel IGBT health status detection model for any abnormal IGBT module, and determine whether the abnormal IGBT module fails according to the abnormal type of the abnormal IGBT module.

For the specific implementation of each module, reference may be made to the descriptions of the foregoing embodiment of the method, and the embodiment of the disclosure will not be reiterated.

In another embodiment of the disclosure, a computer-readable storage medium stored with a program instruction is also provided. When the program instruction is executed by a processor, the method for online monitoring of the health status of the IGBT module as described above is implemented.

Through real-time current monitoring, the health status of each module may be effectively evaluated. At the potential failure stage, the health status of the device is real-time monitored to prevent the loss of the entire system due to the device failure.

The disclosure is simple to implement, has relatively high monitoring precision, has relatively high monitoring sensitivity especially for falling off of internal bonding wires of a module, has relatively good real-time performance, and can online monitor the health status of the IGBT.

It should be pointed out that according to the implementation requirements, each step/component described in the present application may be split into more steps/components, or two or more steps/components or partial operations of a step/component may be combined into a new step/component to implement the objectives of the disclosure.

The method according to the disclosure may be implemented in hardware or firmware, implemented as software or computer code that may be stored in a recording medium (such as CD ROM, RAM, floppy disk, hard disk, or magneto-optical disk), or implemented as computer code that is originally stored in a remote recording medium or a non-transitory machine-readable medium that is downloaded through the network and is stored in a local recording medium, so that the method may be stored in such software processing on a recording medium using a general-purpose computer, a special-purpose processor, or a programmable or special-purpose hardware (such as an application-specific integrated circuit, ASIC or field programmable gate array, FPGA). It may be understood that a computer, processor, microprocessor controller, or programmable hardware includes a storage assembly (such as RAM, ROM, flash memory, etc.) that may store or receive software or computer code. When the software or computer code is accessed and executed by the computer, processor, or hardware, the processing method described here is implemented. In addition, when a general-purpose computer accesses the code for implementing the processing shown here, the execution of the code converts the general-purpose computer into a special-purpose computer for executing the processing shown here.

Persons skilled in the art may easily understand that the above descriptions are only preferred embodiments of the disclosure and are not intended to limit the disclosure. Any modification, equivalent replacement, improvement, etc. made within the spirit and principle of the disclosure should be included in the protection scope of the disclosure.

What is claimed is:

1. A method for online monitoring of a health status of a plurality of insulated-gate bipolar transistor (IGBT) modules coupled in parallel, each IGBT module comprising at least one IGBT, the method comprising:
   determining an abnormal IGBT module from the IGBT modules according to a collector current value of each IGBT module among the IGBT modules;
   extracting the collector current value of the abnormal IGBT module to be compared with a maximum value among measured collector current values of normal IGBT modules determined from the IGBT modules to obtain a current imbalance rate of the abnormal IGBT module;
   determining a type of abnormality of the abnormal IGBT module according to a case temperature of each IGBT module among the IGBT modules; and
   substituting for the current imbalance rate and the case temperature of the abnormal IGBT module into a parallel IGBT health status detection model for the abnormal IGBT module, and determining whether the abnormal IGBT module fails according to the type of abnormality of the abnormal IGBT module.

2. The method according to claim 1, wherein the step of determining the abnormal IGBT module from the IGBT modules according to the collector current value of each IGBT module among the IGBT modules comprises:
   comparing the collector current value of each IGBT module among the IGBT modules, and regarding the IGBT module with the collector current value less than a preset current value as the abnormal IGBT module; and
   the step of determining the type of abnormality of the abnormal IGBT module according to the case temperature of each IGBT module among the parallel IGBT modules comprises:
   comparing the case temperature of the abnormal IGBT module, regarding the abnormal IGBT module with the case temperature less than a preset case temperature value as an abnormal bonding wire IGBT module, and regarding the abnormal IGBT module with the case temperature equal to the preset case temperature value as an abnormal solder layer IGBT module.

3. The method according to claim 2, wherein the current imbalance rate of the abnormal IGBT module is determined from $$\alpha = \frac{I'_C}{I_C},$$

where $I_C$ is the maximum value among the measured collector current values of the normal IGBT modules, and $I_C'$ is the collector current value of the abnormal IGBT module.

4. The method according to claim 3, wherein the parallel IGBT health status detection model is:

$$\frac{I'_C}{I_C} = \frac{[V_{dc} - (V_o + \Delta V)]R - (n-1)\cdot R_{load}\cdot \Delta V}{(V_{dc} - V_o)(R + \Delta R + \Delta R') + R_{load}\cdot \Delta V}$$

if $\Delta V = 0$, then $\alpha = \frac{R}{R + \Delta R + \Delta R'}$ $$\begin{cases} \Delta V = \frac{V_o^{max} - V_o^{typ}}{T^{max} - T^{typ}}(T_j - T^{typ}) + V_o^{typ} = k_1 \Delta T_j + b_1 \\ \Delta R = \frac{R^{max} - R^{typ}}{T^{max} - T^{typ}}(T_j - T^{typ}) + R^{typ} = k_2 \Delta T_j + b_2 \end{cases}$$

$$T_j = P_{loss}\cdot r_{jc} + T_C = (P_{sw} + P_{cond})\cdot r_{jc} + T_C$$
$$\Delta T_j = P_{loss}\cdot \Delta r_{jc} + T_C = (P_{sw} + P_{cond})\cdot \Delta r_{jc} + T_C$$

wherein $V_{dc}$ is an external voltage of a main circuit, $V_o$ is an on voltage of the IGBT module when a temperature is at a room temperature of 25° C., R is an on resistance of the IGBT module when the temperature is at the room temperature of 25° C., $\Delta V$ is an increment of the on voltage at different temperatures, $\Delta R$ is an increment of the on resistance at different temperatures, $\Delta R'$ is an increment of the on resistance when a bonding wire within the IGBT module is broken, $R_{load}$ is a load resistance, $v_o^{max}$ is an on voltage value at a maximum temperature $T^{max}$ given in a data sheet, $V_o^{typ}$ is the on voltage value at a typical temperature $T^{typ}$ given in the data sheet, $R^{max}$ is an on resistance value at the maximum temperature $T^{max}$ given in the data sheet, $R^{typ}$ is the on resistance value at the typical temperature $T^{typ}$ given in the data sheet, $T_j$ is a real-time working temperature of an internal chip of the IGBT module, n represents a coefficient corresponding to a format of how the IGBT modules are coupled in parallel, $k_1$ and $b_1$ represent function coefficients of the on voltage changing with temperature, $k_2$ and $b_2$ represent function coefficients of the on resistance changing with temperature, $\Delta T_j$ represents an increment of a junction temperature caused by different failure processes, $P_{loss}$ represents a power loss of the IGBT module, which comprises a switching power loss $P_{sw}$ and a conduction power loss $P_{cond}$, $r_{jc}$ represents a thermal resistance of the IGBT module from a chip to a case, $T_C$ represents the case temperature of the IGBT module, and $\Delta r_{jc}$ represents an increment of the thermal resistance caused by different failure processes.

5. The method according to claim 4, wherein the step of determining whether the abnormal IGBT module fails according to the type of abnormality of the abnormal IGBT module comprises:
   obtaining the increment of the on resistance of the abnormal IGBT module at different temperatures from the parallel IGBT health status detection model in a case where the type of abnormality of the abnormal IGBT module is a bonding wire breakage abnormality, and determining whether the increment of the on resistance of the abnormal IGBT module at different temperatures is greater than a preset resistance increment value; wherein if the increment of the on resistance is greater than the preset resistance increment value, it is determined that the abnormal IGBT module fails due to bonding wire breakage, or otherwise, it is determined that the abnormal IGBT module does not fail; and
   obtaining the increment of the thermal resistance of the abnormal IGBT module from the parallel IGBT health status detection model in a case where the type of abnormality of the abnormal IGBT module is a solder layer aging abnormality, and determining whether the increment of the thermal resistance of the abnormal IGBT module is greater than a preset thermal resistance increment value, wherein if the increment of the thermal resistance is greater than the preset thermal resistance increment value, it is determined that the IGBT module fails due to solder layer aging, or otherwise, it is determined that the IGBT module does not fail.

6. The method according to claim 1, wherein the current imbalance rate of the abnormal IGBT module is determined from $$\alpha = \frac{I'_C}{I_C},$$

where $I_C$ is the maximum value among the measured collector current values of the normal IGBT modules, and $I_C'$ is the collector current value of the abnormal IGBT module.

7. The method according to claim 6, wherein the parallel IGBT health status detection model is:

$$\frac{I'_C}{I_C} = \frac{[V_{dc} - (V_o + \Delta V)]R - (n-1) \cdot R_{load} \cdot \Delta V}{(V_{dc} - V_o)(R + \Delta R + \Delta R') + R_{load} \cdot \Delta V}$$

$$\text{if } \Delta V = 0, \text{ then } \alpha = \frac{R}{R + \Delta R + \Delta R'}$$

$$\begin{cases} \Delta V = \frac{V_o^{max} - V_o^{typ}}{T^{max} - T^{typ}}(T_j - T^{typ}) + V_o^{typ} = k_1 \Delta T_j + b_1 \\ \Delta R = \frac{R^{max} - R^{typ}}{T^{max} - T^{typ}}(T_j - T^{typ}) + R^{typ} = k_2 \Delta T_j + b_2 \end{cases}$$

$$T_j = P_{loss} \cdot r_{jc} + T_C = (P_{sw} + P_{cond}) \cdot r_{jc} + T_C$$

$$\Delta T_j = P_{loss} \cdot \Delta r_{jc} + T_C = (P_{sw} + P_{cond}) \cdot \Delta r_{jc} + T_C$$

wherein $V_{dc}$ is an external voltage of a main circuit, $V_o$ is an on voltage of the IGBT module when a temperature is at a room temperature of 25° C., R is an on resistance of the IGBT module when the temperature is at the room temperature of 25° C., $\Delta V$ is an increment of the on voltage at different temperatures, $\Delta R$ is an increment of the on resistance at different temperatures, $\Delta R'$ is an increment of the on resistance when a bonding wire within the IGBT module is broken, $R_{load}$ is a load resistance, $v_o^{max}$ is an on voltage value at a maximum temperature $T^{max}$ given in a data sheet, $V_o^{typ}$ is the on voltage value at a typical temperature $T^{typ}$ given in the data sheet, $R^{max}$ is an on resistance value at the maximum temperature $T^{max}$ given in the data sheet, $R^{typ}$ is the on resistance value at the typical temperature $T^{typ}$ given in the data sheet, $T_j$ is a real-time working temperature of an internal chip of the IGBT module, n represents a coefficient corresponding to a format of how the IGBT modules are coupled in parallel, $k_1$ and $b_1$ represent function coefficients of the on voltage changing with temperature, $k_2$ and $b_2$ represent function coefficients of the on resistance changing with temperature, $\Delta T_j$ represents an increment of a junction temperature caused by different failure processes, $P_{loss}$ represents a power loss of the IGBT module, which comprises a switching power loss $P_{sw}$ and a conduction power loss $P_{cond}$, $r_{jc}$ represents a thermal resistance of the IGBT module from a chip to a case, $T_C$ represents the case temperature of the IGBT module, and $\Delta r_{jc}$ represents an increment of the thermal resistance caused by different failure processes.

8. The method according to claim 7, wherein the step of determining whether the abnormal IGBT module fails according to the type of abnormality of the abnormal IGBT module comprises:
obtaining the increment of the on resistance of the abnormal IGBT module at different temperatures from the parallel IGBT health status detection model in a case where the type of abnormality of the abnormal IGBT module is a bonding wire breakage abnormality, and determining whether the increment of the on resistance of the abnormal IGBT module at different temperatures is greater than a preset resistance increment value; wherein if the increment of the on resistance is greater than the preset resistance increment value, it is determined that the abnormal IGBT module fails due to bonding wire breakage, or otherwise, it is determined that the abnormal IGBT module does not fail; and
obtaining the increment of the thermal resistance of the abnormal IGBT module from the parallel IGBT health status detection model in a case where the type of abnormality of the abnormal IGBT module is a solder layer aging abnormality, and determining whether the increment of the thermal resistance of the abnormal IGBT module is greater than a preset thermal resistance increment value, wherein if the increment of the thermal resistance is greater than the preset thermal resistance increment value, it is determined that the IGBT module fails due to solder layer aging, or otherwise, it is determined that the IGBT module does not fail.

9. A system for online monitoring of a health status of a plurality of IGBT modules coupled in parallel, each IGBT module comprising at least one IGBT, the system comprising:
a memory storing a program code; and
a controller configured to access the program code for executing:
an abnormality determination module, configured to determine an abnormal IGBT module from the IGBT modules according to a collector current value of each IGBT module among the IGBT modules;
a current imbalance rate calculation module, configured to extract the collector current value of the abnormal IGBT module to be compared with a maximum value among measured collector current values of normal IGBT modules determined from the IGBT modules to obtain a current imbalance rate of the abnormal IGBT module;
an abnormal type determination module, configured to determine a type of abnormality of the abnormal IGBT module according to a case temperature of each IGBT module among the IGBT modules; and
a failure determination module, configured to substituting for the current imbalance rate and the case temperature of the abnormal IGBT module into a parallel IGBT health status detection model for the abnormal IGBT module, and determine whether the abnormal IGBT module fails according to the type of abnormality of the abnormal IGBT module.

10. The system according to claim 9, wherein the controller is configured to execute:
the abnormality determination module for comparing the collector current value of each IGBT module among the IGBT modules, and regarding the IGBT module with the collector current value less than a preset current value as the abnormal IGBT module; and
the abnormal type determination module for comparing the case temperature of the abnormal IGBT module, regarding the abnormal IGBT module with the case temperature less than a preset case temperature value as an abnormal bonding wire IGBT module, and regarding the abnormal IGBT module with the case temperature equal to the preset case temperature value as an abnormal solder layer IGBT module.

11. The system according to claim 10, wherein the current imbalance rate of the module is determined from $$\alpha = \frac{I'_C}{I_C},$$

where $I_C$ is the maximum value among the measured collector current values of the normal IGBT modules, and $I_C'$ is the collector current value of the abnormal IGBT module.

12. The system according to claim 11, wherein the parallel IGBT health status detection model is:

$$\frac{I'_C}{I_C} = \frac{[V_{dc} - (V_o + \Delta V)]R - (n-1) \cdot R_{load} \cdot \Delta V}{(V_{dc} - V_o)(R + \Delta R + \Delta R') + R_{load} \cdot \Delta V}$$

$$\text{if } \Delta V = 0, \text{ then } \alpha = \frac{R}{R + \Delta R + \Delta R'}$$

$$\begin{cases} \Delta V = \frac{V_o^{max} - V_o^{typ}}{T^{max} - T^{typ}}(T_j - T^{typ}) + V_o^{typ} = k_1 \Delta T_j + b_1 \\ \Delta R = \frac{R^{max} - R^{typ}}{T^{max} - T^{typ}}(T_j - T^{typ}) + R^{typ} = k_2 \Delta T_j + b_2 \end{cases}$$

$$T_j = P_{loss} \cdot r_{jc} + T_C = (P_{sw} + P_{cond}) \cdot r_{jc} + T_C$$

$$\Delta T_j = P_{loss} \cdot \Delta r_{jc} + T_C = (P_{sw} + P_{cond}) \cdot \Delta r_{jc} + T_C$$

where $V_{dc}$ is an external voltage of a main circuit, $V_o$ is an on voltage of the IGBT module when a temperature is at a room temperature of 25° C., R is an on resistance of the IGBT module when the temperature is at the room temperature of 25° C., $\Delta V$ is an increment of the on voltage at different temperatures, $\Delta R$ is an increment of the on resistance at different temperatures, $\Delta R'$ is an increment of the on resistance when a bonding wire within the IGBT module is broken, $R_{load}$ is a load resistance, $V_o^{max}$ is an on voltage value at a maximum temperature $T^{max}$ given in a data sheet, $V_o^{typ}$ is the on voltage value at a typical temperature $T^{typ}$ given in the data sheet, $R^{max}$ is an on resistance value at the maximum temperature $T^{max}$ given in the data sheet, $R^{typ}$ is the on resistance value at the typical temperature $T^{typ}$ given in the data sheet, $T_j$ is a real-time working temperature of an internal chip of the IGBT module, n represents a coefficient corresponding to a format of how the IGBT modules are coupled in parallel, $k_1$ and $b_1$ represent function coefficients of the on voltage changing with temperature, $k_2$ and $b_2$ represent function coefficients of the on resistance changing with temperature, $\Delta T_j$ represents an increment of a junction temperature caused by different failure processes, $P_{loss}$ represents a power loss of the IGBT module, which comprises a switching power loss $P_{sw}$ and a conduction power loss $P_{cond}$, $r_{jc}$ represents a thermal resistance of the IGBT module from a chip to a case, $T_C$ represents the case temperature of the IGBT module, and $\Delta r_{jc}$ represents an increment of the thermal resistance caused by different failure processes.

13. The system according to claim 12, wherein the controller is configured to execute the failure determination module for obtaining the increment of the on resistance of the abnormal IGBT module at different temperatures from the parallel IGBT health status detection model in a case where the type of abnormality of the abnormal IGBT module is a bonding wire breakage abnormality, and determine whether the increment of the on resistance of the abnormal IGBT module at different temperatures is greater than a preset resistance increment value; wherein if the increment of the on resistance is greater than the preset resistance increment value, it is determined that the abnormal IGBT module fails due to bonding wire breakage, or otherwise, it is determined that the abnormal IGBT module does not fail; and in a case where the type of abnormality of the abnormal IGBT module is a solder layer aging abnormality, the increment of the thermal resistance of the abnormal IGBT module is obtained from the parallel IGBT health status detection model, and whether the increment of the thermal resistance of the abnormal IGBT module is greater than a preset thermal resistance increment value is determined, wherein if the increment of the thermal resistance is greater than the preset thermal resistance increment value, it is determined that the IGBT module fails due to solder layer aging, or otherwise, it is determined that the IGBT module does not fail.

14. The system according to claim 9, wherein the current imbalance rate of the module is determined from $$\alpha = \frac{I'_C}{I_C},$$

where $I_C$ is the maximum value among the measured collector current values of the normal IGBT modules, and $I_C'$ is the collector current value of the abnormal IGBT module.

15. The system according to claim 14, wherein the parallel IGBT health status detection model is:

$$\frac{I'_C}{I_C} = \frac{[V_{dc} - (V_o + \Delta V)]R - (n-1) \cdot R_{load} \cdot \Delta V}{(V_{dc} - V_o)(R + \Delta R + \Delta R') + R_{load} \cdot \Delta V}$$

$$\text{if } \Delta V = 0, \text{ then } \alpha = \frac{R}{R + \Delta R + \Delta R'}$$

$$\begin{cases} \Delta V = \frac{V_o^{max} - V_o^{typ}}{T^{max} - T^{typ}}(T_j - T^{typ}) + V_o^{typ} = k_1 \Delta T_j + b_1 \\ \Delta R = \frac{R^{max} - R^{typ}}{T^{max} - T^{typ}}(T_j - T^{typ}) + R^{typ} = k_2 \Delta T_j + b_2 \end{cases}$$

$$T_j = P_{loss} \cdot r_{jc} + T_C = (P_{sw} + P_{cond}) \cdot r_{jc} + T_C$$

$$\Delta T_j = P_{loss} \cdot \Delta r_{jc} + T_C = (P_{sw} + P_{cond}) \cdot \Delta r_{jc} + T_C$$

where $V_{dc}$ is an external voltage of a main circuit, $V_o$ is an on voltage of the IGBT module when a temperature is at a room temperature of 25° C., R is an on resistance of the IGBT module when the temperature is at the room temperature of 25° C., $\Delta V$ is an increment of the on voltage at different temperatures, $\Delta R$ is an increment of the on resistance at different temperatures, $\Delta R'$ is an increment of the on resistance when a bonding wire within the IGBT module is broken, $R_{load}$ is a load resistance, $v_o^{max}$ is an on voltage value at a maximum temperature $T^{max}$ given in a data sheet, $V_o^{typ}$ is the on voltage value at a typical temperature $T^{typ}$ given in the data sheet, $R^{max}$ is an on resistance value at the maximum temperature $T^{max}$ given in the data sheet, $R^{typ}$ is the on resistance value at the typical temperature $T^{typ}$ given in the data sheet, $T_j$ is a real-time working temperature of an internal chip of the IGBT module, n represents a coefficient corresponding to a format of how the IGBT modules are coupled in parallel, $k_1$ and $b_1$ represent function coefficients of the on voltage changing with temperature, $k_2$ and $b_2$ represent function coefficients of the on resistance changing with temperature, $\Delta T_j$ represents an increment of a junction temperature caused by different failure processes, $P_{loss}$ represents a power loss of the IGBT module, which comprises a switching power loss $P_{sw}$ and a conduction power loss $P_{cond}$, $r_{jc}$ represents a thermal resistance of the IGBT module from a chip to a case, $T_C$ represents the case temperature of the IGBT module, and $\Delta r_{jc}$ represents an increment of the thermal resistance caused by different failure processes.

16. The system according to claim 15, wherein the controller is configure to execute the failure determination module for obtaining the increment of the on resistance of the abnormal IGBT module at different temperatures from the parallel IGBT health status detection model in a case where the type of abnormality of the abnormal IGBT module is a bonding wire breakage abnormality, and determining whether the increment of the on resistance of the abnormal IGBT module at different temperatures is greater than a preset resistance increment value; wherein if the increment of the on resistance is greater than the preset resistance increment value, it is determined that the abnormal IGBT module fails due to bonding wire breakage, or otherwise, it is determined that the abnormal IGBT module does not fail; and in a case where the type of abnormality of the abnormal IGBT module is a solder layer aging abnormality, the increment of the thermal resistance of the abnormal IGBT module is obtained from the parallel IGBT health status detection model, and whether the increment of the thermal resistance of the abnormal IGBT module is greater than a preset thermal resistance increment value is determined, wherein if the increment of the thermal resistance is greater than the preset thermal resistance increment value, it is determined that the IGBT module fails due to solder layer aging, or otherwise, it is determined that the IGBT module does not fail.

* * * * *